United States Patent
Fukuda et al.

(10) Patent No.: US 8,145,963 B2
(45) Date of Patent: Mar. 27, 2012

(54) SEMICONDUCTOR INTEGRATED CIRCUIT DEVICE AND DELAY FAULT TESTING METHOD THEREOF

(75) Inventors: Keiko Fukuda, Tokyo (JP); Yoshinori Watanabe, Kanagawa (JP); Ryouichi Bandai, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 440 days.

(21) Appl. No.: 12/533,639

(22) Filed: Jul. 31, 2009

(65) Prior Publication Data

US 2010/0095170 A1 Apr. 15, 2010

(30) Foreign Application Priority Data

Oct. 9, 2008 (JP) ................................. 2008-263182

(51) Int. Cl.
*G01R 31/28* (2006.01)
(52) U.S. Cl. .......... 714/731; 714/726; 714/729; 714/30; 714/727; 714/744; 702/79; 375/259; 324/537
(58) Field of Classification Search .................. None
See application file for complete search history.

(56) References Cited

U.S. PATENT DOCUMENTS

| 2005/0055614 | A1* | 3/2005 | Yeh ................................ 714/726 |
| 2005/0076278 | A1* | 4/2005 | Vermeulen et al. ........... 714/731 |
| 2006/0064616 | A1* | 3/2006 | Rajski et al. .................. 714/726 |
| 2007/0288184 | A1* | 12/2007 | Konishi et al. .................. 702/79 |
| 2008/0010573 | A1* | 1/2008 | Sul ................................ 714/731 |
| 2009/0187801 | A1* | 7/2009 | Pandey ........................ 714/729 |
| 2010/0011264 | A1* | 1/2010 | Pugliesi-Conti et al. ..... 714/731 |
| 2010/0188096 | A1* | 7/2010 | Waayers et al. ............... 324/537 |
| 2010/0316142 | A1* | 12/2010 | Tsuchiya et al. .............. 375/259 |

FOREIGN PATENT DOCUMENTS

| JP | 2006-329737 | 12/2006 |
| JP | 2008-263182 | 10/2008 |

* cited by examiner

*Primary Examiner* — John Trimmings
(74) *Attorney, Agent, or Firm* — Oblon, Spivak, McClelland, Maier & Neustadt, L.L.P.

(57) ABSTRACT

A semiconductor integrated circuit device includes a first clock domain having a plurality of first flip-flops which is configured to operate with a high-speed clock; a second clock domain having a plurality of second flip-flops, composed of a third flip-flop and a plurality of fourth flip-flops, which is configured to operate with a low-speed clock; and a test clock supplying section configured to supply, at a time of delay fault test for the second clock domain, a test clock based on the high-speed clock to the third flip-flop to which data from the first clock domain is input, and not to supply the test clock to the plurality of fourth flip-flops.

17 Claims, 3 Drawing Sheets

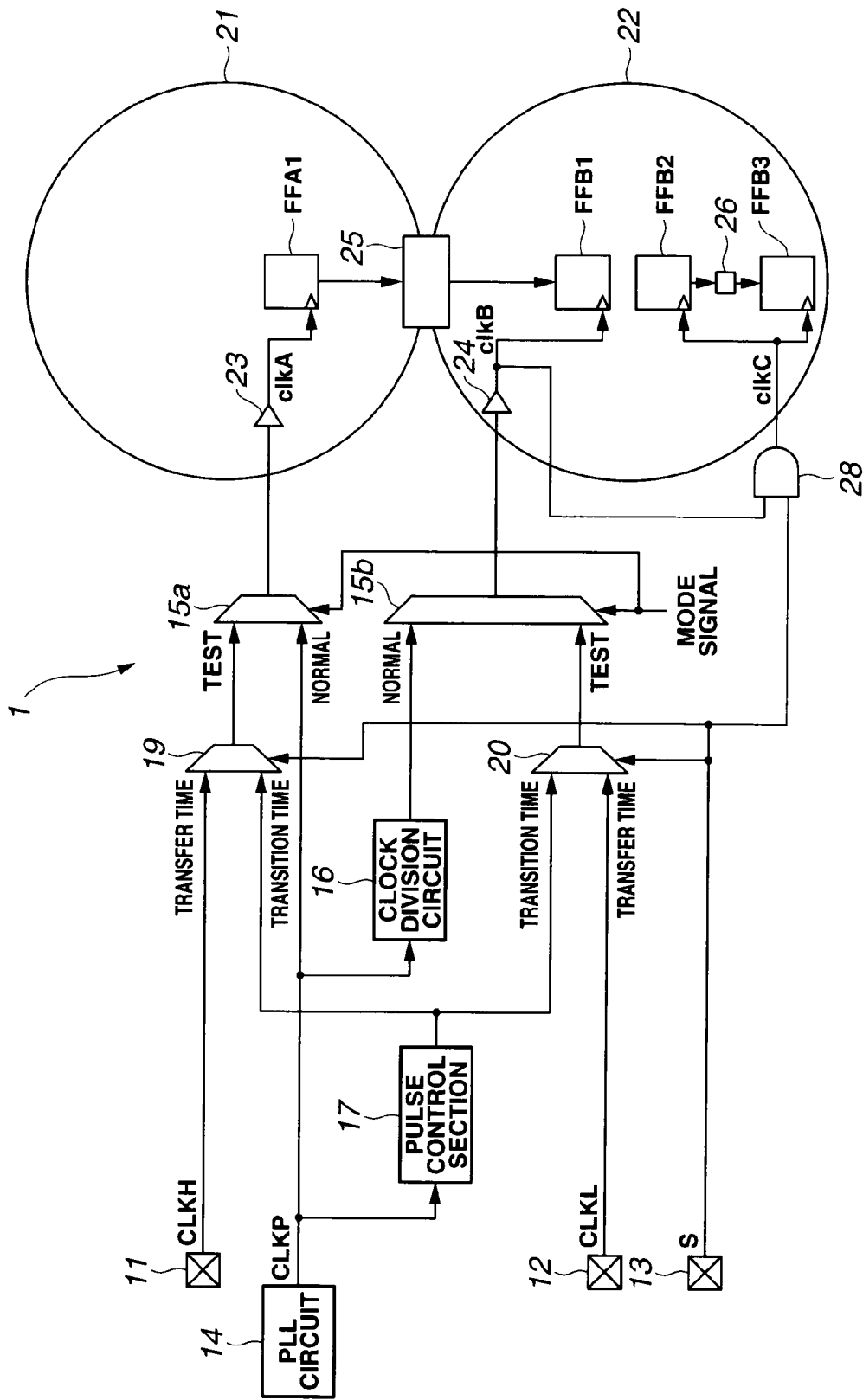

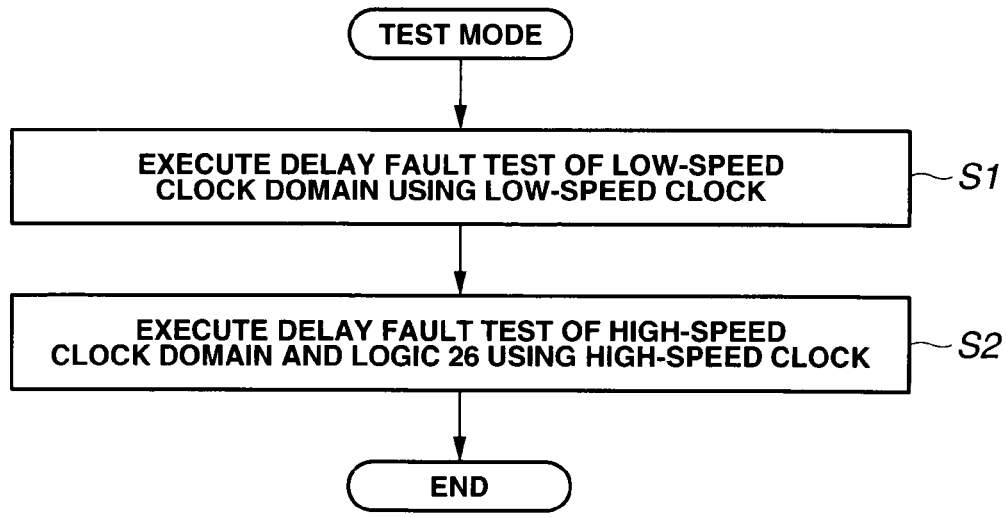
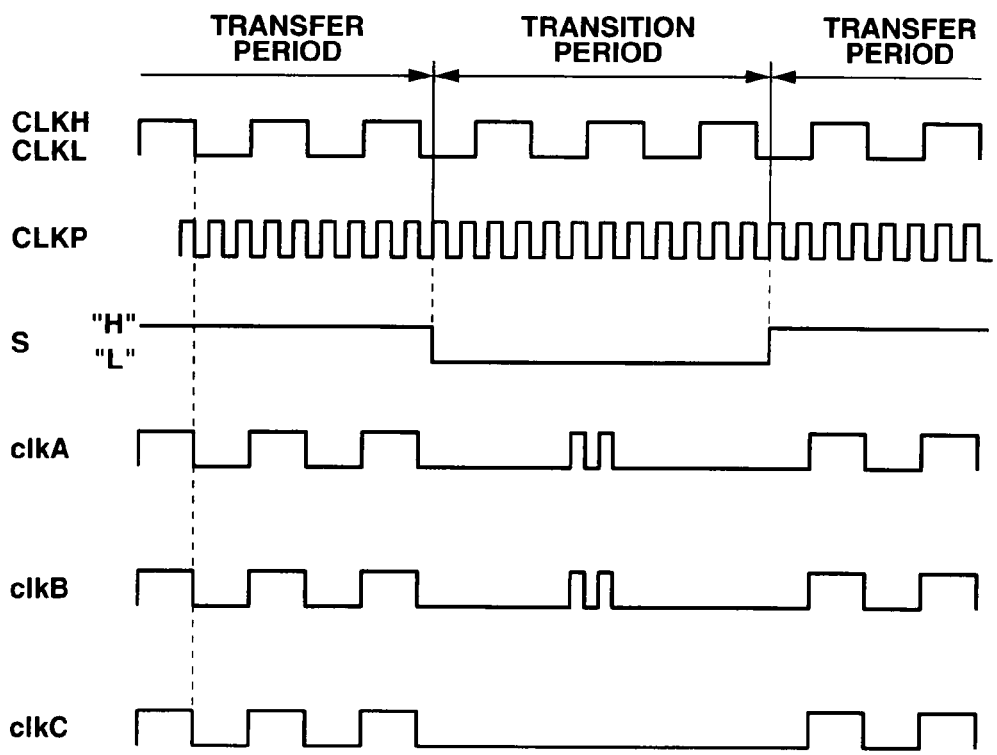

SEMICONDUCTOR INTEGRATED CIRCUIT DEVICE AND DELAY FAULT TESTING METHOD THEREOF

CROSS-REFERENCE TO RELATED APPLICATIONS

This application is based upon and claims the benefit of priority from the prior Japanese Patent Application No. 2008-263182 filed in Japan on Oct. 9, 2008; the entire contents of which are incorporated herein by reference.

BACKGROUND OF THE INVENTION

1. Field of the Invention

The present invention relates to a semiconductor integrated circuit device that has a plurality of clock domains that operate at different frequencies, and to a delay fault testing method thereof.

2. Description of Related Art

Conventionally, a large number of flip-flops are configured in a large-scale integrated circuit (LSI). For the purpose of fault diagnosis of such an LSI, a scan chain that is configured as scan flip-flops that have flip-flops inside the circuit in a chain path may be employed.

In recent years, accompanying the speeding up of the target circuits, a test for a delay fault (delay fault test) is also being employed. The delay fault test is adapted to determine whether or not data transition is possible within a predetermined delay time, for combinational circuit sections between flip-flops of a scan-designed circuit.

In the delay fault test, first, a scan chain is utilized to set required values for the flip-flops. Next, two clock signals are applied with frequencies desired for the test, at high speed. Thereby, a change in a value generated in a flip-flop at a former stage (hereafter, referred to as "pre-stage flip-flop") with the initial clock pulse (launch pulse) is provided to a logic, and the output of the logic is captured by a flip-flop at a latter stage (hereafter, referred to as "post-stage flip-flop") with the second clock pulse (capture pulse). By retrieving the output of the post-stage flip-flop via a scan chain, a delay fault of the logic at the test frequency between the pre-stage flip-flop and the post-stage flip-flop can be detected.

Further, in recent years, drive frequencies of elements inside LSIs have become extremely high. For example, in some cases a high speed clock having a frequency of 500 MHz is used. With respect to delay fault tests also, a test using a high speed clock is required in order to support such high speed operation. In this case, if it is attempted to supply a launch and a capture pulse (hereunder, also referred to as "test clock") from a tester outside of the LSI, measurement of the delay fault test is difficult due to waveform distortion. Therefore, a method may be considered in which the test clock is generated by using output of a PLL circuit that is configured in the LSI.

Furthermore, inside an LSI, elements driving at a high speed and elements driving at a low speed are sometimes provided in a mixed manner. Even in this case, it is possible to perform a delay fault test with respect to each element group by supplying a high speed test clock to the elements driving at a high speed and supplying a low speed test clock to the elements driving at a low speed.

However, there are cases in which a logic that is the test object is located between an element group driving at a high speed and an element group driving at a low speed. That is, there are cases where a logic exists which is supplied with the output of an element group driving at a high speed, and whose output is output to an element group driving at a low speed.

Regarding this kind of logic, the pre-stage flip-flop belongs to an element group driving at a high speed and the post-stage flip-flop belongs to an element group driving at a low speed. In order to detect a delay fault in this kind of logic, it is necessary that a launch pulse for inputting a value into the logic and a capture pulse for capturing an output of the logic are high speed clocks. That is, it is necessary to supply a high speed clock to the post-stage flip-flop also, and this means that a high speed clock is supplied to the element group driving at a low speed. Operation according to a high speed clock is not guaranteed for an element group driving at a low speed, and in some cases errors occur due to timing violations when an element group driving at a low speed is operated with a high speed clock. In this case, since a detection result for a delay fault is obtained via a scan chain of the element group driving at a low speed, there is a possibility that the detection result for the delay fault will be an error.

In this connection, Japanese Patent Application Laid Open Publication No. 2007-327838 discloses a method that carries out a delay fault test using a high-speed test clock for elements driving at a high speed, and a low-speed test clock for elements driving at a low speed. However, according to the method disclosed in Japanese Patent Application Laid Open Publication No. 2007-327838, the circuitry is complicated because a high-speed test clock and a low-speed test clock are respectively supplied to the necessary elements.

BRIEF SUMMARY OF THE INVENTION

A semiconductor integrated circuit device according to one aspect of the present invention includes a first clock domain in which a plurality of first flip-flops are provided on a data path, and which is configured to operate with a first clock; a second clock domain in which a plurality of second flip-flops are provided on a data path, and which is configured to operate with a second clock of a lower frequency than a frequency of the first clock; a first test clock supplying section configured to supply a test clock based on the first clock to all of the first flip-flops at a time of a delay fault test; and a second test clock supplying section configured to supply, at the time of the delay fault test, a test clock based on the first clock to a third flip-flop to which data from the first clock domain is input among the plurality of second flip-flops, and not to supply the test clock to a plurality of fourth flip-flops excluding the third flip-flop among the plurality of second flip-flops.

Further, a delay fault testing method of a semiconductor integrated circuit device according to another aspect of the present invention is a delay fault testing method of a semiconductor integrated circuit device that includes a first clock domain in which a plurality of first flip-flops are provided on a data path and which is configured to operate with a first clock, and a second clock domain in which a plurality of second flip-flops are provided on a data path and which is configured to operate with a second clock of a lower frequency than a frequency of the first clock, in which the plurality of second flip-flops have a third flip-flop into which data from the first clock domain is input and a plurality of fourth flip-flops other than the third flip-flop among the plurality of second flip-flops, and the method includes, in a transfer period of the delay fault test, supplying a third clock of a frequency that is less than or equal to a frequency of the second clock to all of the first and second flip-flops, and in a transition period of the delay fault test, supplying a test clock based on the first clock to all of the flip-flops excluding the fourth flip-flops among the first and second flip-flops.

BRIEF DESCRIPTION OF THE DRAWINGS

FIG. 1 is a block diagram that illustrates a semiconductor integrated circuit device according to a first embodiment of the present invention;

FIG. 2 is a flowchart for explaining operations of the embodiment;

FIG. 3 is a timing chart for explaining operations of the embodiment; and

DETAILED DESCRIPTION OF THE INVENTION

Figure 4:
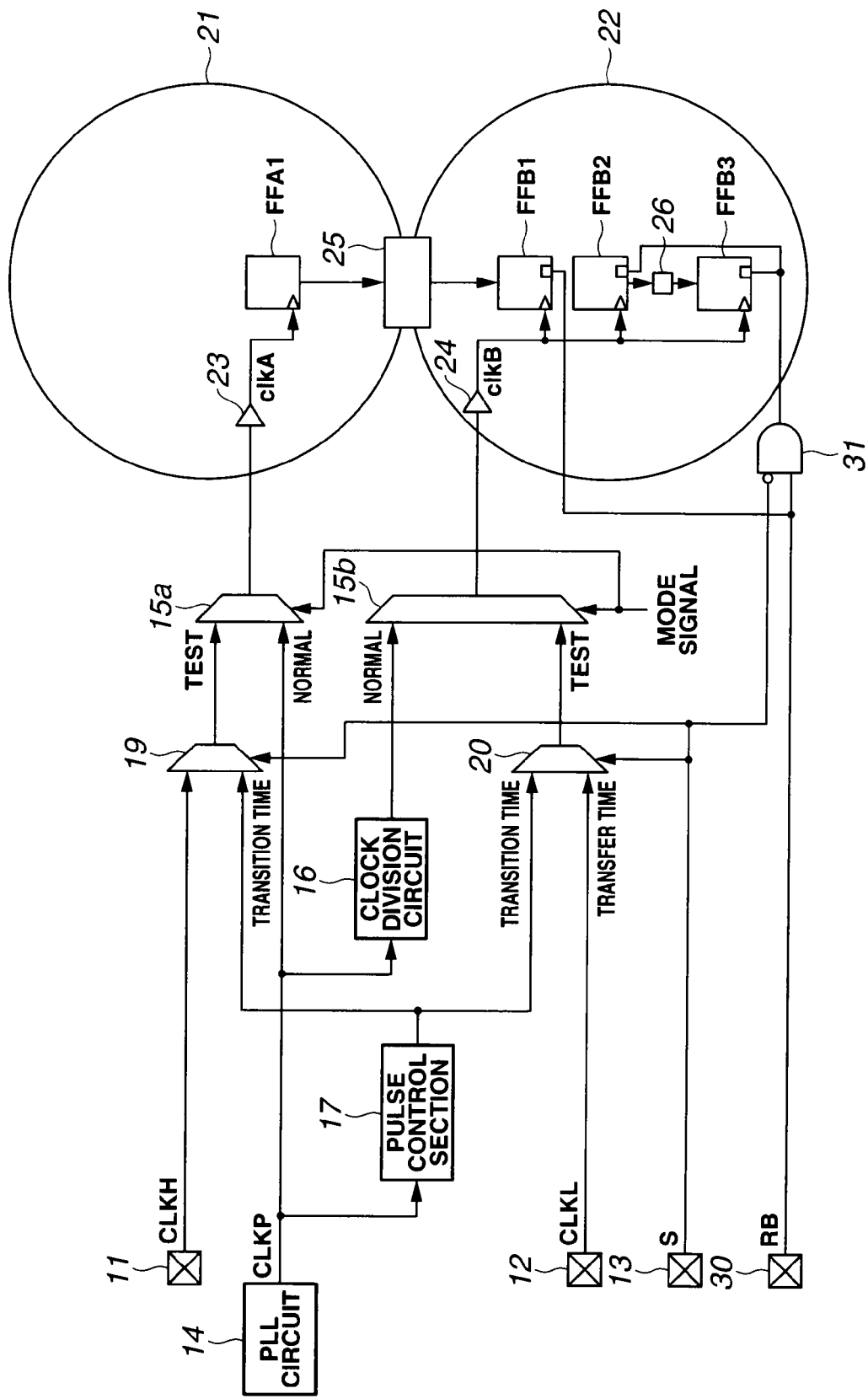
FIG. 4 is a block diagram showing a second embodiment of the present invention.

Hereunder, embodiments of the present invention are described in detail referring to the drawings.

First Embodiment

FIG. 1 is a block diagram showing a semiconductor integrated circuit device according to a first embodiment of the present invention.

In FIG. 1, a high-speed clock domain 21 and a low-speed clock domain 22 are configured on a semiconductor integrated circuit device 1. An unshown plurality of logics and flip-flops are configured in the clock domains 21 and 22. The respective flip-flops of each of the clock domains 21 and 22 are formed into respective scan chains.

Note that although a flip-flop is a storage element that holds a value on a data path, in the present specification it is assumed that a flip-flop includes a latch circuit.

According to the example shown in FIG. 1, the high-speed clock domain 21 has an unshown plurality of flip-flops that include a flip-flop FFA1 and an unshown plurality of logics. Further, in the example shown in FIG. 1, the low-speed clock domain 22 has an unshown plurality of flip-flops that include flip-flops FFB1 to FFB3 and an unshown plurality of logics including a logic 26. The flip-flops FFB1 to FFB3 form a common scan chain by means of unshown wiring.

In the clock domains 21 and 22, a data transfer is performed via an unshown data path at a time of a normal mode that implements functions of the system. Further, at a time of a test mode such as a scan test, a data transfer is also performed via an unshown scan path utilizing a scan chain.

When in the normal mode, each element inside the high-speed clock domain 21 and the low-speed clock domain 22 operates based on the output of a PLL circuit 14 that is described later. More specifically, the configuration is such that each flip-flop inside the high-speed clock domain 21 operates with a high speed clock CLKP that is supplied from the PLL circuit 14, and each flip-flop inside the low-speed clock domain 22 operates with a low-speed clock supplied thereto that is obtained by dividing the high speed clock CLKP.

A value is input to the logic 26 inside the low-speed clock domain 22 via the flip-flop FFB2 on the data path, and after performing a predetermined logical operation, the logic 26 outputs a value to the flip-flop FFB3.

In contrast, the logic 25 is configured to receive a value that is input via the flip-flop FFA1 on the data path, and after performing a predetermined logical operation, to output a value to the flip-flop FFB1. More specifically, in the normal mode, data is transferred to the logic 25 from the flip-flop FFA1 that operates according to the high speed clock CLKP, such that the logic 25 operates at a high speed. The logic 25 then outputs the result obtained by the high speed operation to the flip-flop FFB1 inside the low-speed clock domain 22 that operates with a low-speed clock.

The PLL circuit 14 generates the high speed clock CLKP. The high speed clock CLKP is supplied to a selector 15a, a clock division circuit 16, and a pulse control section 17. The clock division circuit 16 divides the high speed clock CLKP to generate a low-speed clock, and outputs the low-speed clock to a selector 15b.

The selector 15a selects a clock to be supplied to each element inside the high-speed clock domain 21, and is controlled by a mode signal that designates the normal mode or the test mode. In the normal mode, the selector 15a supplies the clock CLKP from the PLL circuit 14 to the high-speed clock domain 21. In the test mode, the selector 15a supplies an output of a selector 19 to the high-speed clock domain 21.

The selector 15b selects a clock to be supplied to each element inside the low-speed clock domain 22, and is controlled by a mode signal. In the normal mode, the selector 15b supplies a low-speed clock from the clock division circuit 16 to the low-speed clock domain 22. In the test mode, the selector 15b supplies an output of a selector 20 to the low-speed clock domain 22.

As a result, in the normal mode a high speed clock CLKP from the PLL circuit 14 is supplied to the high-speed clock domain 21 via the selector 15a, and a low-speed clock from the clock division circuit 16 is supplied to the low-speed clock domain 22 via the selector 15b.

A clock CLKH, a clock CLKL, and a control signal S are input into terminals 11 to 13, respectively. The clock CLKH is a clock used when a value is transferred utilizing a scan chain in the high-speed clock domain 21. The clock CLKL is a clock used when a value is transferred utilizing a scan chain in the low-speed clock domain 22.

The clocks CLKH and CLKL are both set to a frequency that is less than or equal to the frequency of the low-speed clock that is supplied to the low-speed clock domain 22 in the normal mode.

The control signal S is a signal for specifying a period to effect a transition of a logical value on the data path (hereunder, referred to as "transition period") and a period to transfer a value of a flip-flop utilizing a scan chain (hereunder, referred to as "transfer period") for the purpose of delay fault detection on the data path between the flip-flop FFA1 and the flip-flop FFB1 in the test mode. The control signal S, for example, becomes high level (hereunder, referred to as "H level") in a transfer period and low level (hereunder, referred to as "L level") in a transition period. The control signal S is always at H level in the normal mode. The control signal S is supplied to the selectors 19 and 20 and an AND gate 28.

The clock CLKH is provided to the selector 19, and the clock CLKL is provided to the selector 20. The selector 19 selects the output of the pulse control section 17 in a transition period. In a transfer period, the selector 19 selects the clock CLKH and outputs the clock CLKH to the selector 15a as a signal in the test mode. The selector 20 selects the output of the pulse control section 17 in a transition period. In a transfer period, the selector 20 selects the clock CLKL and outputs the clock CLKL to the selector 15b as a signal in the test mode.

The pulse control section 17 generates a test clock for the purpose of detecting a delay fault. In a transition period, the pulse control section 17 outputs two pulses that are consecutive high speed clocks CLKP as a launch pulse and a capture pulse. The test clock from the pulse control section 17 is supplied to the selectors 19 and 20.

Thus, when in the test mode, in a transfer period the clock CLKH is supplied via the selectors 19 and 15a to the high-speed clock domain 21 and the clock CLKL is supplied via the selectors 20 and 15b to the low-speed clock domain 22. Further, in a transition period, a test clock from the pulse control section 17 is supplied via the selectors 19 and 15a to the high-speed clock domain 21, and a test clock from the pulse control section 17 is supplied via the selectors 20 and 15b to the low-speed clock domain 22.

The clock from the selector 15a is supplied to each flip-flop inside the high-speed clock domain 21 via buffers 23 that are respectively provided in each clock path. Further, the clock from the selector 15b is supplied to each flip-flop inside the low-speed clock domain 22 via buffers 24 that are respectively provided in each clock path.

In the present embodiment, the output of the buffer 24 inside the low-speed clock domain 22 is directly supplied only to the post-stage flip-flop FFB1 of the logic 25. Within the low-speed clock domain 22, a clock from the AND gate 28 is supplied to all flip-flops other than the post-stage flip-flop FFB1. The output of the buffer 24 and the control signal S is input to the AND gate 28. The AND gate 28 is configured to supply a clock from the buffer 24 to all flip-flops other than the post-stage flip-flop FFB1 only in a case in which the control signal S is at H level.

Next, operations of the embodiment configured in this manner are described with reference to FIG. 2 and FIG. 3. FIG. 2 is a flowchart for explaining operations of the embodiment. FIG. 3 is a timing chart for explaining operations of the embodiment.

In the normal mode, a high speed clock from the PLL circuit 14 is supplied to the high-speed clock domain 21 via the selector 15a. Thereby, each element inside the high-speed clock domain 21 operates according to the high speed clock CKLP. Further, the high speed clock CLKP from the PLL circuit 14 is supplied to the clock division circuit 16 and divided to generate a low-speed clock. The low-speed clock from the clock division circuit 16 is supplied to the low-speed clock domain 22 via the selector 15b. In this manner, each element inside the low-speed clock domain 22 operates according to the low-speed clock.

Next, operations of the test mode are described.

When a delay fault is to be detected, two kinds of tests are performed. One kind of test uses a high speed clock, and the other kind of test uses a low-speed clock. More specifically, in step S1 in FIG. 2, a delay fault test using a low-speed clock that is supplied to the low-speed clock domain 22 is executed in the normal mode. Subsequently, in step S2, a delay fault test using a high-speed clock that is supplied to the high-speed clock domain 21 is performed in the normal mode. Note that either of the delay fault tests of step S1 and step S2 may be executed first.

In step S1, by executing a test using a low-speed clock for the high-speed clock domain 21 and the low-speed clock domain 22, it is possible to at least confirm the existence/non-existence of a delay fault with respect to the low-speed clock domain 22. In this connection, conventionally, since no particular problem arises when a test using a low-speed clock is performed, a description of such a test is omitted herein.

The circuit shown in FIG. 1 illustrates a configuration that supports a delay fault test using a high speed clock. According to the present embodiment, by performing a delay fault test using a high speed clock, it is possible to perform a delay fault test for each logic inside the high-speed clock domain 21 as well as a delay fault test for the logic that is positioned between the high-speed clock domain 21 and the low-speed clock domain 22.

When commencement of a delay fault test by means of a scan test is designated by the mode signal, the selectors 15a and 15b select the output of the selectors 19 and 20, respectively. When the delay fault test starts, as shown in FIG. 3, the control signal S becomes H level that indicates a transfer period. Thereby, the selectors 19 and 20 select clocks CLKH and CLKL that are supplied to terminals 11 and 12. The clocks CLKH and CLKL from the terminals 11 and 12 are supplied via the selectors 19 and 20 and the selectors 15a and 15b to the high-speed clock domain 21 and the low-speed clock domain 22.

As shown in FIG. 3, the clocks CLKH and CLKL are set to a sufficiently low frequency. By using the clocks CLKH and CLKL, each flip-flop inside the high-speed clock domain 21 and the low-speed clock domain 22 is reliably driven, and a value necessary for the test can be set in each flip-flop.

When a value is set in each flip-flop inside the high-speed clock domain 21 and the low-speed clock domain 22, the control signal S becomes L level to specify a transition period. Thereby, the selectors 19 and 20 select the output of the pulse control section 17. The high speed clock CLKP is supplied to the pulse control section 17. At a predetermined timing within the transition period the pulse control section 17 outputs only two pulses that are consecutive high speed clocks CLKP as a launch and a capture pulse (test clock), respectively.

The test clock from the pulse control section 17 is supplied to each flip-flop inside the high-speed clock domain 21 via the selectors 19 and 15a. A test clock clkA shown in FIG. 3 is provided to the flip-flop FFA1 inside the high-speed clock domain 21 via the buffer 24.

A test clock from the pulse control section 17 is also supplied to the low-speed clock domain 22 via the selectors 20 and 15b. A test clock clkB shown in FIG. 3 is supplied to the buffer 24 inside the low-speed clock domain 22. The clock clkB is supplied to the flip-flop FFB1 via the buffer 24.

In the present embodiment, a control signal S that is L level is input to the AND gate 28 in a transition period, and a clock clkC shown in FIG. 3 is supplied from the AND gate 28 to all flip-flops inside the low-speed clock domain 22 except the flip-flop FFB1. More specifically, in a transition period, a test clock is not output from the AND gate 28. That is, in a transition period, a test clock is supplied only to the post-stage flip-flop FFB1 inside the low-speed clock domain 22.

By the initial pulse (launch pulse) of the transition period being supplied to the pre-stage flip-flop FFA1 of the high-speed clock domain 21, the value that has been captured by the pre-stage flip-flop FFA1 is supplied to the logic 25, and a logical operation is performed at the logic 25.

Next, when the capture pulse that is the second pulse that is generated is supplied to the post-stage flip-flop FFB1, the post-stage flip-flop FFB1 captures the result of the logical operation by the logic 25 with the capture pulse, and outputs the result. When a delay fault has not occurred in the logic 25, an expected value with respect to the value that is set in the logic 25 is output from the post-stage flip-flop FFB1.

In this connection, in a transition period, since the clock clkC is supplied to the pre-stage flip-flop FFB2 and the post-stage flip-flop FFB3 of the logic 26, and high-speed launch and capture pulses are not supplied thereto, a timing violation does not occur in the logic 26. Accordingly, an error is not transferred to the post-stage flip-flop FFB3 that holds the output of the logic 26.

The transition period ends by the control signal S changing to H level. Thereby, the operation shifts to a transfer period. In the transfer period the clocks CLKH and CLKL that are input via the terminals 11 and 12 are supplied to the low-speed clock domain 22. In the transfer period, the control signal S is at H level, and the clocks CLKH and CLKL are supplied to all flip-flops within the low-speed clock domain 22. Thereby, the output of the post-stage flip-flop FFB1 is output via respective flip-flops forming a scan chain.

In a transition period, a high-speed test clock is not supplied to any of the flip-flops inside the low-speed clock domain 22 except the post-stage flip-flop FFB1. Accordingly, in a transition period, a case does not arise in which a timing violation error that is caused by use of a high speed clock is held in a flip-flop that holds the output of a logic inside the low-speed clock domain 22.

Consequently, in a transfer period, even when the output of the post-stage flip-flop FFB1 is transferred utilizing a scan chain inside the low-speed clock domain 22, the output of the post-stage flip-flop FFB1 can be retrieved without an error, and the existence/non-existence of a delay fault in the logic 25 can be reliably detected.

Thus, according to the present embodiment, in a transition period that supplies a test clock during a delay fault test, supply of the test clock to all flip-flops inside the low-speed clock domain 22 other than the post-stage flip-flop FFB1 is stopped. As a result, a situation does not arise in which all the flip-flops other than the post-stage flip-flop FFB1 inside the low-speed clock domain 22 operate according to a high speed clock, and neither does a case arise in which an error of a logic is held in the aforementioned flip-flops. It is thus possible to perform a delay fault test of a logic located between the high-speed clock domain 21 and the low-speed clock domain 22 by using only one kind of test clock, and employing a simple configuration.

Second Embodiment

FIG. 4 is a block diagram that illustrates the second embodiment of the present invention. In FIG. 4, components that are the same as in FIG. 1 are denoted by the same reference numerals, and a description of those components is omitted below.

The present embodiment differs from the first embodiment in that a test reset control section 31 is provided instead of the AND gate 28. A reset signal RB for resetting each flip-flop inside the low-speed clock domain 22 is supplied to a terminal 30. The reset signal RB from the terminal 30 is supplied to the flip-flop FFB1 inside the low-speed clock domain 22, and is also provided to the test reset control section 31.

The test reset control section 31 receives input of the reset signal RB at one input terminal thereof, and receives input of an inverted signal of the control signal S at another input terminal thereof. The test reset control section 31 is configured to supply the reset signal RB to all flip-flops inside the low-speed clock domain 22 except the flip-flop FFB1 in a period when the control signal S is at L level, that is, during a transition period.

In the present embodiment configured in this manner, the operations in a transfer period during a delay fault test are the same as in the first embodiment. In the present embodiment, in a transition period the test clocks clkA and clkB (see FIG. 3) are supplied to not only all the flip-flops inside the high-speed clock domain 21, but also to all the flip-flops inside the low-speed clock domain 22.

As a result, in a transition period the launch pulse shown in FIG. 3 is provided via the buffer 23 to the flip-flop FFA1 inside the high-speed clock domain 21. By means of this launch pulse, the value that has been captured by the pre-stage flip-flop FFA1 is supplied to the logic, and a logical operation is performed at the logic 25.

At the next clock timing, the capture pulse shown in FIG. 3 is supplied to the flip-flop FFB1 inside the low-speed clock domain 22 via the buffer 24 within the low-speed clock domain 22. By means of the capture pulse, the post-stage flip-flop FFB1 captures and outputs the result of the logical operation of the logic 25. When a delay fault has not occurred in the logic 25, an expected value with respect to the value that is set in the logic 25 is output from the post-stage flip-flop FFB1.

In a transition period, an inverted signal of the control signal S becomes H level, and the test reset control section 31 supplies the reset signal RB to all the flip-flops inside the low-speed clock domain 22 other than the flip-flop FFB1.

As a result, all the flip-flops inside the low-speed clock domain 22 other than the flip-flop FFB1 are reset. Even if a timing violation has occurred due to a high speed clock being supplied to the low-speed clock domain 22, an error caused by the timing violation is not held in any of the flip-flops inside the low-speed clock domain 22 except the flip-flop FFB1.

Upon entering a transfer period, the inverted signal of the control signal S becomes L level, and the test reset control section 31 does not output the reset signal RB. In the transfer period, the clocks CLKH and CLKL are supplied to all the flip-flops inside the low-speed clock domain 22 (see FIG. 3). As a result, the output of the post-stage flip-flop FFB1 is output via each flip-flop forming the scan chain.

Thus, according to the present embodiment also, in a transition period in which a test clock is supplied during a delay fault test, all of the flip-flops other than the post-stage flip-flop FFB1 inside the low-speed clock domain 22 are reset. As a result, a situation does not arise in which an error caused by a timing violation is held in any of the flip-flops other than the post-stage flip-flop FFB1 inside the low-speed clock domain 22, and it is possible a delay fault test of the logic between the high-speed clock domain 21 and the low-speed clock domain 22.

It should be noted that although examples are described according to the foregoing embodiments in which there are two kinds of clock domains with different operating frequencies, naturally the present invention can be similarly applied to a case with three or more kinds of clock domains.

Having described the preferred embodiments of the invention referring to the accompanying drawings, it should be understood that the present invention is not limited to those precise embodiments and various changes and modifications thereof could be made by one skilled in the art without departing from the spirit or scope of the invention as defined in the appended claims.

What is claimed is:

1. A semiconductor integrated circuit device, comprising:
   a first clock domain in which a plurality of first flip-flops are provided on a data path, and which is configured to operate with a first clock;
   a second clock domain in which a plurality of second flip-flops are provided on a data path, and which is configured to operate with a second clock of a lower frequency than a frequency of the first clock;
   a first test clock supplying section configured to supply a test clock based on the first clock to all of the first flip-flops at a time of a delay fault test; and
   a second test clock supplying section configured to supply, at the time of the delay fault test, a test clock based on the first clock to a third flip-flop to which data from the first clock domain is input among the plurality of second flip-flops, and not to supply the test clock to a plurality of fourth flip-flops excluding the third flip-flop among the plurality of second flip-flops.

2. The semiconductor integrated circuit device according to claim 1, wherein the first and second flip-flops comprise a scan chain.

3. The semiconductor integrated circuit device according to claim 1, further comprising a logic circuit configured to perform a logical operation with respect to data that is supplied from the first flip-flop via the data path, and supply a result of the logical operation to the third flip-flop via the data path.

4. The semiconductor integrated circuit device according to claim 1, wherein the test clock comprises a launch pulse and a capture pulse that are generated at the same frequency as the frequency of the first clock.

5. The semiconductor integrated circuit device according to claim 1, wherein the first and second test clock supplying sections are configured to supply a third clock of a frequency that is less than or equal to a frequency of the second clock to all of the first and second flip-flops in a transfer period of the delay fault test, and to supply the test clock to all of the first and third flip-flops in a transition period of the delay fault test.

6. The semiconductor integrated circuit device according to claim 5, wherein the second test clock supplying section comprises:
    a first clock path configured to supply the test clock to the third flip-flop;
    a second clock path configured to supply the test clock to all of the fourth flip-flops; and
    a first gate circuit configured to cut-off the second clock path in the transition period.

7. The semiconductor integrated circuit device according to claim 6, wherein the first gate circuit is controlled by a control signal that indicates a transition period of the delay fault test and a period other than the transition period.

8. The semiconductor integrated circuit device according to claim 5, wherein the second test clock supplying section comprises:
    a first clock path configured to supply the test clock to the third flip-flop;
    a reset path configured to supply a reset signal to all of the fourth flip-flops; and
    a second gate circuit configured to allow the reset signal to pass through the reset path only in the transition period.

9. The semiconductor integrated circuit device according to claim 8, wherein the second gate circuit is controlled by a control signal that indicates a transition period of the delay fault test and a period other than the transition period.

10. The semiconductor integrated circuit device according to claim 1, comprising:
    a PLL circuit configured to generate the first clock; and
    a clock division circuit configured to divide the first clock to generate the second clock.

11. The semiconductor integrated circuit device according to claim 10, comprising:
    a pulse control section configured to generate the test clock using the first clock from the PLL circuit.

12. The semiconductor integrated circuit device according to claim 11, comprising:
    a first selector configured to selectively provide an output of the PLL circuit and the test clock or the third clock to the first clock domain according to a mode signal that indicates the delay fault test period; and
    a second selector configured to selectively provide an output of the clock division circuit and the test clock or the third clock to the second clock domain according to the mode signal.

13. The semiconductor integrated circuit device according to claim 12, comprising:
    a third selector configured to selectively provide an output of the pulse control section and the third clock to the first selector according to a control signal that indicates a transition period of the delay fault test and a period other than the transition period; and
    a fourth selector configured to selectively provide an output of the pulse control section and the third clock to the second selector according to a control signal that indicates a transition period of the delay fault test and a period other than the transition period.

14. A delay fault testing method of a semiconductor integrated circuit device comprising a first clock domain in which a plurality of first flip-flops are provided on a data path and which is configured to operate with a first clock, and a second clock domain in which a plurality of second flip-flops are provided on a data path and which is configured to operate with a second clock of a lower frequency than a frequency of the first clock, in which the plurality of second flip-flops have a third flip-flop into which data from the first clock domain is input and a plurality of fourth flip-flops other than the third flip-flop among the plurality of second flip-flops, the method comprising:
    in a transfer period of the delay fault test, supplying a third clock of a frequency that is less than or equal to a frequency of the second clock to all of the first and second flip-flops; and
    in a transition period of the delay fault test, supplying a test clock based on the first clock to all of the flip-flops excluding the fourth flip-flops among the first and second flip-flops.

15. The delay fault testing method according to claim 14, wherein:
    the first and second flip-flops comprise a scan chain;
    in the transfer period, a value on the data path is set via the scan chain by supplying the third clock to all of the first and second flip-flops;
    in the transition period, a value on the data path is caused to undergo a transition by supplying the test clock to all flip-flops excluding the fourth flip-flops among the first and second flip-flops; and
    in the transfer period, the third clock is supplied to all of the first and second flip-flops to retrieve a value that has undergone a transition on the data path via the scan chain.

16. The delay fault testing method according to claim 14, wherein the test clock comprises a launch pulse and a capture pulse that are generated at the same frequency as the frequency of the first clock.

17. The delay fault testing method according to claim 14, further comprising:
    in an other transfer period that is different from the transfer period, setting a value on the data path via the scan chain by supplying the third clock to all of the first and second flip-flops; and
    in an other transition period that is different from the transition period, supplying a test clock based on the second clock to all of the first and second flip-flops.

* * * * *